United States Patent
Nakagawa et al.

(10) Patent No.: US 9,646,904 B2
(45) Date of Patent: *May 9, 2017

(54) CURABLE RESIN COMPOSITION, AND CURED PRODUCT OF SAME

(71) Applicant: DAICEL CORPORATION, Osaka-shi, Osaka (JP)

(72) Inventors: Yasunobu Nakagawa, Ohtake (JP); Shigeaki Kamuro, Himeji (JP)

(73) Assignee: DAICEL CORPORATION, Osaka-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/758,480

(22) PCT Filed: Jan. 9, 2014

(86) PCT No.: PCT/JP2014/050190
§ 371 (c)(1),
(2) Date: Jun. 29, 2015

(87) PCT Pub. No.: WO2014/109349
PCT Pub. Date: Jul. 17, 2014

(65) Prior Publication Data
US 2015/0340299 A1    Nov. 26, 2015

(30) Foreign Application Priority Data
Jan. 9, 2013 (JP) .................................. 2013-002104

(51) Int. Cl.
| | | |
|---|---|---|
| C08G 77/08 | (2006.01) |
| H01L 23/29 | (2006.01) |
| C09D 183/04 | (2006.01) |
| C09J 183/04 | (2006.01) |
| C08G 77/50 | (2006.01) |
| C08L 83/04 | (2006.01) |
| C08K 5/3492 | (2006.01) |
| C08L 83/10 | (2006.01) |
| C08L 83/14 | (2006.01) |
| C08L 83/08 | (2006.01) |
| C08K 5/5419 | (2006.01) |
| C08G 77/20 | (2006.01) |
| C08G 77/04 | (2006.01) |

(52) U.S. Cl.
CPC ............ *H01L 23/296* (2013.01); *C08G 77/50* (2013.01); *C08K 5/34924* (2013.01); *C08L 83/04* (2013.01); *C09D 183/04* (2013.01); *C09J 183/04* (2013.01); *C08G 77/045* (2013.01); *C08G 77/20* (2013.01); *C08K 5/5419* (2013.01); *C08L 83/08* (2013.01); *C08L 83/10* (2013.01); *C08L 83/14* (2013.01); *H01L 2924/0002* (2013.01)

(58) Field of Classification Search
CPC .......... C08L 83/04; C08L 83/08; C08L 83/10; C08L 83/14
See application file for complete search history.

(56) References Cited

U.S. PATENT DOCUMENTS

| | | | | |
|---|---|---|---|---|
| 5,442,083 A | * | 8/1995 | Kobayashi | ............. C08G 77/50 |
| | | | | 556/434 |
| 2008/0042142 A1 | | 2/2008 | Sugawara et al. | |
| 2008/0207848 A1 | * | 8/2008 | Morita | ............... C08G 59/3254 |
| | | | | 525/475 |
| 2011/0046310 A1 | | 2/2011 | Kashiwagi et al. | |
| 2012/0226010 A1 | * | 9/2012 | Ganachaud | ........... C07F 7/0874 |
| | | | | 528/21 |
| 2014/0332987 A1 | | 11/2014 | Kamuro et al. | |
| 2015/0126700 A1 | | 5/2015 | Kamuro et al. | |

FOREIGN PATENT DOCUMENTS

| | | |
|---|---|---|
| EP | 1 857 488 A1 | 11/2007 |
| EP | 2 289 979 A1 | 3/2011 |
| EP | 2 857 457 A1 | 4/2015 |
| JP | 2002-314140 A | 10/2002 |
| JP | 2006-206721 A | 8/2006 |
| JP | 2007-31619 A | 2/2007 |
| JP | 2012-7126 A | 1/2012 |
| JP | 2012-77142 A | 4/2012 |
| JP | 2012-111875 A | 6/2012 |
| JP | 2012-162666 A | 8/2012 |
| TW | 201107378 A1 | 3/2011 |
| WO | WO 2011/111667 A1 | 9/2011 |
| WO | WO 2013/094625 A1 | 6/2013 |
| WO | WO 2013/176238 A1 | 11/2013 |

OTHER PUBLICATIONS

Extended European Search Report, dated Nov. 11, 2015, for European Application No. 14738183.4.
Taiwanese Office Action, dated Sep. 4, 2015, for Taiwanese Application No. 103100828 with an English translation.
International Preliminary Report on Patentability, issued in PCT/JP2014/050190, dated Jan. 27, 2015.
International Search Report, issued in PCT/JP2014/050190, dated Apr. 15, 2014.

* cited by examiner

*Primary Examiner* — Margaret Moore
(74) *Attorney, Agent, or Firm* — Birch, Stewart, Kolasch & Birch, LLP

(57) ABSTRACT

The curable resin composition according to the present invention includes a polyorganosiloxane (A), a silsesquioxane (B), an isocyanurate compound (C), and a silane coupling agent (D). The polyorganosiloxane (A) is a polyorganosiloxane approximately devoid of aryl groups. The silsesquioxane (B) includes a ladder-like silsesquioxane. The curable resin composition has excellent heat resistance, transparency and flexibility. It offers superior reflow resistance and barrier properties to a corrosive gas.

26 Claims, No Drawings

CURABLE RESIN COMPOSITION, AND CURED PRODUCT OF SAME

TECHNICAL FIELD

The present invention relates to curable resin compositions and cured products thereof. The present application claims priority to Japanese Patent Application No. 2013-002104 filed to Japan on Jan. 9, 2013, the entire contents of which are incorporated herein by reference.

BACKGROUND ART

In semiconductor devices requiring superior heat resistance and high breakdown voltage, semiconductor elements are covered or encapsulated by materials. These materials generally require such heat resistance as to endure heat at a temperature of about 150° C. or higher. In particular, materials (encapsulants) to cover or encapsulate optical elements such as optical semiconductor elements require excellent physical properties such as transparency and flexibility, in addition to the heat resistance. Such encapsulants currently used typically in backlight units of liquid crystal displays are exemplified by epoxy resin materials and silicone resin materials.

Patent Literature (PTL) 1 discloses a synthetic high-molecular compound as a material that is highly resistant to heat and dissipates heat satisfactorily. The synthetic high-molecular compound contains at least one third organosilicon polymer having a molecular weight of from 20000 to 800000. The third organosilicon polymer has been formed by linking at least one first organosilicon polymer with at least one second organosilicon polymer through siloxane bonds. The first organosilicon polymer includes a cross-linked siloxane structure, where the siloxane structure refers to a Si—O—Si bonded structure. The second organosilicon polymer includes a linear, linked siloxane structure. Materials of this type, however, are still lower in physical properties.

PTL 2 discloses a resin composition for optical element encapsulation as a resin composition that has excellent transparency, ultraviolet resistance, and thermal coloration resistance and is used for the encapsulation of an optical element. The resin composition contains, as a resin component, at least one silsesquioxane selected from the group consisting of liquid silsesquioxanes including a cage-like structure, containing an aliphatic carbon-carbon unsaturated bond, and being devoid of H—Si bonds; and liquid silsesquioxanes including a cage-like structure, containing a H—Si bond, and being devoid of aliphatic carbon-carbon unsaturated bonds. Unfortunately, however, the resin composition containing such a cage-like silsesquioxane gives a cured product that is relatively rigid, is poorly flexible, and is susceptible to cracking and/or fracture.

PTL 3 discloses a curable composition that essentially contains an organic compound containing at least two carbon-carbon double bonds per molecule, a compound containing at least two SiH groups per molecule, and a hydrosilylation catalyst, where the carbon-carbon double bonds are reactive with SiH groups. The organic compound is exemplified by triallyl isocyanurate. The compound containing at least two SiH groups per molecule is exemplified by chain and/or cyclic polyorganosiloxanes. Disadvantageously, however, materials of this type are still lower in physical properties such as cracking resistance.

CITATION LIST

Patent Literature

PTL 1: Japanese Unexamined Patent Application Publication (JP-A) No. 2006-206721
PTL 2: JP-A No. 2007-031619
PTL 3: JP-A No. 2002-314140

SUMMARY OF INVENTION

Technical Problem

Encapsulants for optical semiconductor elements generally require, in addition to the properties, resistance to deterioration even upon the application of heat at a high temperature in a reflow process in the production of optical semiconductor devices. Specifically, the encapsulants require such properties as to resist cracking and not to cause troubles such as detachment from the package. These properties are also generically referred to as "reflow resistance". As used herein the term "cracking resistance" refers to such a property of an encapsulant as to resist cracking.

In addition, the encapsulants for optical semiconductor elements require high barrier properties to a corrosive gas such as a $SO_x$ gas. This is because metal materials typically of electrodes in the optical semiconductor devices are readily corroded by the corrosive gas and, once corroded, disadvantageously deteriorate in electrical properties (e.g., electrical properties in a high-temperature environment) with time. Encapsulants using the conventional silicone resin materials are widely used as the encapsulants for optical semiconductor elements. Unfortunately, the encapsulants of this type have lower barrier properties to a corrosive gas. Likewise, the materials described in PTL 1 to 3 disadvantageously have lower barrier properties to a corrosive gas.

Accordingly, it is an object of the present invention to provide a curable resin composition capable of forming a cured product that has excellent heat resistance, transparency, and flexibility and, in particular, offers superior reflow resistance and barrier properties to a corrosive gas. The reflow resistance is exemplified by cracking resistance and package adhesion in a reflow process.

It is another object of the present invention to provide a cured product that has excellent heat resistance, transparency, and flexibility and, in particular, offers superior reflow resistance and barrier properties to a corrosive gas.

Solution to Problem

The present inventors have found a curable resin composition that includes a polyorganosiloxane approximately devoid of aryl groups and further includes a ladder-like polyorganosilsesquioxane, an isocyanurate compound, and a silane coupling agent; and have found that this curable resin composition can form a cured product that has excellent heat resistance, transparency, and flexibility and, in particular, offers superior reflow resistance and barrier properties to a corrosive gas. The present invention has been made based on these findings.

Specifically, the present invention provides, in one aspect, a curable resin composition including a polyorganosiloxane (A), a silsesquioxane (B), an isocyanurate compound (C), and a silane coupling agent (D). The polyorganosiloxane (A)

is a polyorganosiloxane approximately devoid of aryl groups. The silsesquioxane (B) includes a ladder-like silsesquioxane.

The silsesquioxane (B) in the curable resin composition may include a ladder-like silsesquioxane containing an aliphatic carbon-carbon double bond in molecule.

The silsesquioxane (B) in the curable resin composition may include a ladder-like silsesquioxane containing a Si—H bond in molecule.

The silsesquioxane (B) in the curable resin composition may include a ladder-like silsesquioxane containing an aryl group in molecule.

The isocyanurate compound (C) in the curable resin composition may include an isocyanurate compound represented by Formula (1):

[Chem. 1]

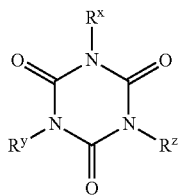
(1)

where $R^x$, $R^y$, and $R^z$ are each, identically or differently, selected from a group represented by Formula (2) and a group represented by Formula (3):

[Chem. 2]

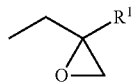
(2)

[Chem. 3]

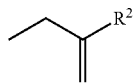
(3)

where $R^1$ and $R^2$ are each, identically or differently, selected from hydrogen and $C_1$-$C_8$ straight or branched chain alkyl.

In the curable resin composition, at least one of $R^x$, $R^y$, and $R^z$ in Formula (1) may be the group represented by Formula (3).

The present invention provides, in another aspect, a cured product of the curable resin composition.

The present invention also provides, in yet another aspect, an encapsulating agent including the curable resin composition.

In addition and advantageously, the present invention provides a semiconductor device obtained by using the encapsulating agent.

Specifically, the present invention relates to the followings.

[1] A curable resin composition including a polyorganosiloxane (A), a silsesquioxane (B), an isocyanurate compound (C), and a silane coupling agent (D). The polyorganosiloxane (A) is a polyorganosiloxane approximately devoid of aryl groups. The silsesquioxane (B) includes a ladder-like silsesquioxane.

[2] In the curable resin composition according to [1], the polyorganopolysiloxane (A) may have a number-average molecular weight of from 500 to 20000.

[3] In the curable resin composition according to one of [1] and [2], the polyorganopolysiloxane (A) may have a weight-average molecular weight of from 500 to 50000.

[4] The curable resin composition according to any one of [1] to [3] may contain the polyorganosiloxane (A) in a content (amount) of from 55 to 95 percent by weight based on the total amount (100 percent by weight) of the curable resin composition.

[5] In the curable resin composition according to any one of [1] to [4], the polyorganosiloxane (A) may include a polyorganosiloxysilalkylene.

[6] In the curable resin composition according to [5], the polyorganosiloxysilalkylene may include a polyorganosiloxysilalkylene including a structure represented by Formula (I).

[7] In the curable resin composition according to one of [5] and [6], the polyorganosiloxysilalkylene may include both a first polyorganosiloxysilalkylene and a second polyorganosiloxysilalkylene, where the first polyorganosiloxysilalkylene contains an aliphatic carbon-carbon unsaturated bond at a terminus and/or in a side chain, and the second polyorganosiloxysilalkylene contains a hydrogen atom (hydrido) bonded to a silicon atom at a terminus and/or in a side chain.

[8] In the curable resin composition according to any one of [5] to [7], the polyorganosiloxysilalkylene may include both a polyorganosiloxysilalkylene including a structure represented by Formula (I-1) and a polyorganosiloxysilalkylene including a structure represented by Formula (I-2):

[Chem. 4]

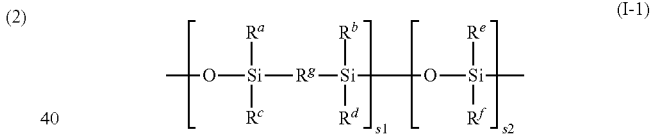
(I-1)

where $R^a$ to $R^f$ are, independently in each occurrence, selected from hydrogen, an aryl-free monovalent hydrocarbon group, and a monovalent heterocyclic group, where at least one of $R^a$ to $R^f$ is a monovalent group containing an aliphatic carbon-carbon unsaturated bond; $R^g$ represents, independently in each occurrence, an aryl-free divalent hydrocarbon group; and s1 and s2 each independently represent an integer of 1 or more,

[Chem. 5]

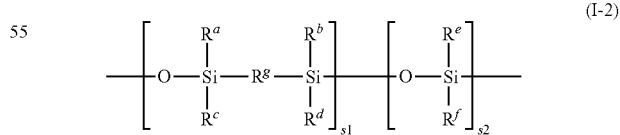
(I-2)

where $R^a$ to $R^f$ are, independently in each occurrence, selected from hydrogen, an aryl-free monovalent hydrocarbon group, and a monovalent heterocyclic group, where at least one of $R^a$ to $R^f$ is hydrogen; $R^g$ represents, independently in each occurrence, an aryl-free divalent hydrocarbon group; and s1 and s2 each independently represent an integer of 1 or more.

[9] In the curable resin composition according to [8], $R^a$ to $R^f$ in Formula (I-1) may be, independently in each occurrence, selected from hydrogen, straight or branched chain alkyl, and a monovalent group containing an aliphatic carbon-carbon unsaturated bond, where at least one of $R^a$ to $R^f$ is a monovalent group containing an aliphatic carbon-carbon unsaturated bond, and $R^a$ to $R^f$ in Formula (I-2) may be, independently in each occurrence, selected from hydrogen, straight or branched chain alkyl, and a monovalent group containing an aliphatic carbon-carbon unsaturated bond, where at least one of $R^a$ to $R^f$ is hydrogen.

[10] In the curable resin composition according to any one of [5] to [9], the polyorganosiloxane (A) may contain the polyorganosiloxysilalkylene in a proportion of from 60 to 100 percent by weight based on the total amount (100 percent by weight) of the polyorganosiloxane (A).

[11] The curable resin composition according to any one of [1] to [10] may contain the silsesquioxane (B) in a content (amount) of from 5 to 45 percent by weight based on the total amount (100 percent by weight) of the curable resin composition.

[12] In the curable resin composition according to any one of [1] to [11], the silsesquioxane (B) may include a ladder-like silsesquioxane (B1) containing an aliphatic carbon-carbon double bond in molecule.

[13] In the curable resin composition according to [12], the ladder-like silsesquioxane (B1) may contain the aliphatic carbon-carbon double bond in a number of from 2 to 50 in molecule (per molecule).

[14] In the curable resin composition according to one of [12] and [13], the ladder-like silsesquioxane (B1) may contain the aliphatic carbon-carbon double bond in a content of from 0.7 to 5.5 mmol/g.

[15] In the curable resin composition according to any one of [12] to [14], the ladder-like silsesquioxane (B1) may contain the aliphatic carbon-carbon double bond in a proportion (by weight) in terms of vinyl of from 2.0 to 15.0 percent by weight.

[16] In the curable resin composition according to any one of [12] to [15], the ladder-like silsesquioxane (B1) may have a viscosity of from 100 to 100000 mPa·s at 23° C.

[17] In the curable resin composition according to any one of [1] to [16], the silsesquioxane (B) may include a ladder-like silsesquioxane (B2) containing a Si—H bond in molecule.

[18] In the curable resin composition according to [17], the ladder-like silsesquioxane (B2) may contain the after-mentioned hydrogen atom or after-mentioned group containing a Si—H bond in a number of from 2 to 50 in molecule (per molecule).

[19] In the curable resin composition according to one of [17] and [18], the ladder-like silsesquioxane (B2) may contain the hydrogen atom or the group containing a Si—H bond in a content of from 0.01 to 0.5 mmol/g.

[20] In the curable resin composition according to any one of [17] to [19], the ladder-like silsesquioxane (B2) may contain the hydrogen atom or the group containing a Si—H bond in a proportion (by weight) of from 0.01 to 0.50 percent by weight in terms of H, where the term "in terms of H" refers to "in terms of the weight of hydrogen atom or H (hydrido) in the Si—H bond.

[21] In the curable resin composition according to any one of [17] to [20], the ladder-like silsesquioxane (B2) may have a viscosity of from 100 to 100000 mPa·s at 23° C.

[22] In the curable resin composition according to any one of [17] to [21], the silsesquioxane (B) may contain the ladder-like silsesquioxane (B1) and the ladder-like silsesquioxane (B2) in a proportion (in a total amount) of 60 percent by weight or more based on the total amount (100 percent by weight) of the silsesquioxane (B).

[23] In the curable resin composition according to any one of [1] to [22], the silsesquioxane (B) may include a ladder-like silsesquioxane containing an aryl group in molecule.

[24] In the curable resin composition according to any one of [1] to [23], the isocyanurate compound (C) may include the isocyanurate compound represented by Formula (1).

[25] In the curable resin composition according to [24], at least one of $R^x$, $R^y$, and $R^z$ in Formula (1) may be the group represented by Formula (3).

[26] The curable resin composition according to any one of [1] to [25] may contain the isocyanurate compound (C) in a content of from 0.01 to 10 percent by weight based on the total amount (100 percent by weight) of the curable resin composition.

[27] In the curable resin composition according to any one of [1] to [26], the silane coupling agent (D) may include an epoxy-containing silane coupling agent.

[28] The curable resin composition according to any one of [1] to [27] may contain the silane coupling agent (D) in a content of from 0.01 to 15 percent by weight based on the total amount (100 percent by weight) of the curable resin composition.

[29] The curable resin composition according to any one of [1] to [28] may have such a formulation (blending formulation) that the amount of aliphatic carbon-carbon double bonds is 0.2 to 4 moles per mole of hydrosilyl groups present in the curable resin composition.

[30] The curable resin composition according to any one of [1] to [29] may have a viscosity of from 300 to 20000 mPa·s at 23° C.

[31] A cured product obtained by curing the curable resin composition according to any one of [1] to [30].

[32] An encapsulating agent including the curable resin composition according to any one of [1] to [30].

[33] A semiconductor device obtained by using the encapsulating agent according to [32].

Advantageous Effects of Invention

The curable resin composition according to the present invention has the configuration and can therefore form a cured product that has excellent heat resistance, transparency, and flexibility. In particular, the cured product has excellent reflow resistance, more specifically, typically has excellent cracking resistance and package adhesion in a reflow process, and still offers superior barrier properties to a corrosive gas such as a SOx gas. The curable resin composition according to the present invention is therefore preferably usable as an encapsulating agent for an optical semiconductor element (light-emitting diode). Assume that the curable resin composition according to the present invention is cured to give a cured product that encapsulates the optical semiconductor element to give an optical semiconductor device. In this case, the resulting optical semiconductor device has quality and durability both at superior levels. In particular, the curable resin composition according to the present invention is useful as an encapsulating agent for a next-generation light source that requires such heat resistance as to endure an unprecedented high temperature (e.g., 180° C. or higher).

DESCRIPTION OF EMBODIMENTS

The curable resin composition according to the present invention includes a polyorganosiloxane (A), a silsesquioxane (B), an isocyanurate compound (C), and a silane coupling agent (D). The polyorganosiloxane (A) is a polyorganosiloxane approximately devoid of aryl groups. The silsesquioxane (B) includes a ladder-like silsesquioxane.

Polyorganosiloxane (A)

The polyorganosiloxane (A) in the curable resin composition according to the present invention is a polyorganosiloxane that contains a siloxane bond (Si—O—Si) backbone and is approximately devoid of aryl groups. The use of the polyorganosiloxane (A) (polyorganosiloxane approximately devoid of aryl groups) can give a cured product that has excellent heat resistance, flexibility, and cracking resistance. The polyorganosiloxane (A) may include a polyorganosiloxane containing a straight chain or branched chain. Among them, the polyorganosiloxane (A) preferably includes a polyorganosiloxane containing a branched chain, from the viewpoint of strength of the cured product.

The polyorganosiloxane (A) may contain silicon atoms each bearing one or more substituents. The substituents are exemplified by hydrogen, groups containing a Si—H bond, aryl-free substituted or unsubstituted hydrocarbon groups (of which alkyl, alkenyl, cycloalkyl, and cycloalkenyl are preferred), hydroxy, alkoxy, alkenyloxy, acyloxy, mercapto (thiol), alkylthio, alkenylthio, carboxy, alkoxycarbonyl, amino or substituted amino (e.g., mono- or di-alkylamino and acylamino), epoxy, and halogen.

The alkyl is preferably $C_1$-$C_{10}$ alkyl, and more preferably $C_1$-$C_4$ alkyl. The alkenyl is preferably $C_2$-$C_{10}$ alkenyl, and more preferably $C_2$-$C_4$ alkenyl. The cycloalkyl is preferably $C_3$-$C_{12}$ cycloalkyl. The cycloalkenyl is preferably $C_3$-$C_{12}$ cycloalkenyl. The alkoxy is preferably $C_1$-$C_6$ alkoxy. The alkenyloxy is preferably $C_1$-$C_6$ alkenyloxy. The acyloxy is preferably $C_1$-$C_6$ acyloxy. The alkylthio is preferably $C_1$-$C_6$ alkylthio. The alkenylthio is preferably $C_1$-$C_6$ alkenylthio. The carboxy is preferably $C_1$-$C_6$ carboxy. The alkoxycarbonyl is preferably ($C_1$-$C_6$ alkoxy)-carbonyl.

The polyorganosiloxane (A) particularly preferably includes a polyorganosiloxane containing, as the substituent, at least one substituent selected from the group consisting of hydrogen, groups containing a Si—H bond, and aryl-free substituted or unsubstituted hydrocarbon groups (of which alkyl or alkenyl is preferred).

The polyorganopolysiloxane (A) may have a number-average molecular weight not critical, but preferably from 500 to 20000, more preferably from 1000 to 10000, and furthermore preferably from 2000 to 8000. The polyorganosiloxane (A) may have a weight-average molecular weight not critical, but preferably from 500 to 50000, more preferably from 5000 to 40000, and furthermore preferably from 10000 to 30000. The number-average molecular weight and/or the weight-average molecular weight may be calculated typically as a molecular weight determined by gel permeation chromatography and calibrated with a polystyrene standard.

The curable resin composition according to the present invention may include each of different polyorganosiloxanes alone or in combination as the polyorganosiloxane (A).

The curable resin composition according to the present invention may contain the polyorganosiloxane (A) in a content (amount) not critical, but preferably from 55 to 95 percent by weight, more preferably from 60 to 92 percent by weight, and furthermore preferably from 65 to 90 percent by weight, based on the total amount (100 percent by weight) of the curable resin composition. The curable resin composition, if containing the polyorganosiloxane (A) in a content less than 55 percent by weight, may cause the cured product to have lower cracking resistance. In contrast, the curable resin composition, if containing the polyorganosiloxane (A) in a content greater than 95 percent by weight, may fail to allow the cured product to have sufficient gas barrier properties to a corrosive gas such as a SOx gas.

As the polyorganosiloxane (A), particularly preferred is a polyorganosiloxysilalkylene. The "polyorganosiloxysilalkylene" herein refers to a polyorganosiloxane that contains a —Si-A- group [silalkylene; where A represents alkylene] in addition to —Si—O— group (siloxy group) in the backbone. The alkylene moiety (the moiety A) in the silalkylene of the polyorganosiloxysilalkylene is exemplified by $C_1$-$C_{12}$ straight or branched chain alkylene, of which $C_2$-$C_4$ straight or branched chain alkylene is preferred, and ethylene is particularly preferred. As compared with a polyorganosiloxane in a narrow sense (polyorganosiloxane having a backbone including —Si—O— groups alone), the polyorganosiloxysilalkylene less forms a low-molecular-weight ring and less decomposes due typically to heating to generate resulting silanol group (—SiOH) upon production process. The polyorganosiloxysilalkylene therefore gives a cured product that tends to less cause surface tack and to less suffer from yellowing. The polyorganosiloxysilalkylene may be produced typically by a method described in JP-A No. 2012-140617. The polyorganosiloxysilalkylene may also be available as products typically under the trade names of GD-1012A and GD-1012B (each from Eternal Chemical Co., Ltd.).

More specifically, the polyorganosiloxysilalkylene is exemplified by a polyorganosiloxysilalkylene including a structure represented by Formula (I):

[Chem. 6]

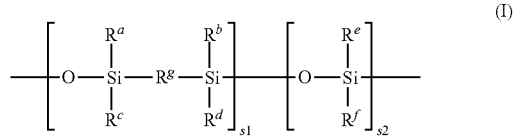

In Formula (I), $R^a$, $R^b$, $R^c$, $R^d$, $R^e$, and $R^f$ ($R^a$ to $R^f$) are, independently in each occurrence, selected from hydrogen, an aryl-free monovalent hydrocarbon group, and a monovalent heterocyclic group. At least one of $R^a$ to $R^f$ may be selected from hydrogen and a monovalent group containing an aliphatic carbon-carbon unsaturated bond.

The aryl-free monovalent hydrocarbon group is exemplified by monovalent aliphatic hydrocarbon groups; monovalent alicyclic hydrocarbon groups; and monovalent groups each including two or more of aliphatic hydrocarbon groups and alicyclic hydrocarbon groups bonded to each other. The monovalent heterocyclic group is exemplified by pyridyl, furyl, and thienyl.

The monovalent aliphatic hydrocarbon groups are exemplified by alkyl, alkenyl, and alkynyl. The alkyl is exemplified by $C_1$-$C_{20}$ straight or branched chain alkyl such as methyl, ethyl, propyl, isopropyl, butyl, hexyl, octyl, isooctyl, decyl, and dodecyl, of which $C_1$-$C_{10}$ alkyl is preferred, and $C_1$-$C_4$ alkyl is more preferred. The alkenyl is exemplified by $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl, of which $C_2$-$C_{10}$ alkenyl is preferred, and $C_2$-$C_4$ alkenyl is more preferred. The alkynyl is exemplified by $C_2$-$C_{20}$ alkynyl such as ethynyl and propynyl, of which $C_2$-$C_{10}$ alkynyl is preferred, and $C_2$-$C_4$ alkynyl is more preferred.

The monovalent alicyclic hydrocarbon groups are exemplified by $C_3$-$C_{12}$ cycloalkyl such as cyclopropyl, cyclobutyl, cyclopentyl, cyclohexyl, and cyclododecyl; $C_3$-$C_{12}$ cycloalkenyl such as cyclohexenyl; and $C_4$-$C_{15}$ bridged hydrocarbon groups such as bicycloheptyl and bicycloheptenyl.

The groups including an aliphatic hydrocarbon group and an alicyclic hydrocarbon group bonded to each other are exemplified by cyclohexylmethyl and methylcyclohexyl.

The aryl-free monovalent hydrocarbon group may have one or more substituents. In other words, the aryl-free monovalent hydrocarbon group may be a group corresponding to any of the above-exemplified aryl-free monovalent hydrocarbon groups, except for replacing at least one hydrogen atom with a substituent. The substituent may have carbon atom(s) in a number of from 0 to 20, more preferably from 0 to 10. Specifically, the substituent is exemplified by halogen; hydroxy; alkoxy; alkenyloxy; acyloxy; mercapto; alkylthio; alkenylthio; carboxy; alkoxycarbonyl; amino; mono- or di-alkylamino; acylamino; epoxy-containing groups; oxetanyl-containing groups; acyl; oxo; isocyanato; and groups including two or more of these groups bonded to each other, where necessary, through $C_1$-$C_6$ alkylene.

The alkoxy is exemplified by $C_1$-$C_6$ alkoxy such as methoxy, ethoxy, propoxy, isopropyloxy, butoxy, and isobutyloxy, of which $C_1$-$C_4$ alkoxy is preferred. The alkenyloxy is exemplified by $C_2$-$C_6$ alkenyloxy such as allyloxy, of which $C_2$-$C_4$ alkenyloxy is preferred. The acyloxy is exemplified by $C_1$-$C_{12}$ acyloxy such as acetyloxy, propionyloxy, (meth)acryloyloxy, and benzoyloxy.

The alkylthio is exemplified by $C_1$-$C_6$ alkylthio such as methylthio and ethylthio, of which $C_1$-$C_4$ alkylthio is preferred. The alkenylthio is exemplified by $C_2$-$C_6$ alkenylthio such as alkylthio, of which $C_2$-$C_4$ alkenylthio is preferred. The alkoxycarbonyl is exemplified by ($C_1$-$C_6$ alkoxy)-carbonyl such as methoxycarbonyl, ethoxycarbonyl, propoxycarbonyl, and butoxycarbonyl. The mono- or di-alkylamino is exemplified by mono- or di-$C_1$-$C_6$ alkyl-amino such as methylamino, ethylamino, dimethylamino, and diethylamino. The acylamino is exemplified by $C_1$-$C_{11}$ acylamino such as acetylamino, propionylamino, and benzoylamino. The epoxy-containing groups are exemplified by glycidyl, glycidyloxy, and 3,4-epoxycyclohexyl. The oxetanyl-containing groups are exemplified by ethyloxetanyloxy. The acyl is exemplified by acetyl, propionyl, and benzoyl. The halogen is exemplified by chlorine, bromine, and iodine.

The monovalent heterocyclic group may have one or more substituents. The substituents are exemplified as with the substituents which the monovalent hydrocarbon group may have.

More specifically, the aryl-free monovalent hydrocarbon group and the monovalent heterocyclic group are exemplified by methyl, ethyl, propyl, isopropyl, butyl, hexyl, octyl, decyl, and substituted hydrocarbon groups (e.g., 2-(3,4-epoxycyclohexyl)ethyl, 3-glycidylpropyl, 3-methacryloxypropyl, 3-acryloxypropyl, N-2-(aminoethyl)-3-aminopropyl, 3-aminopropyl, 3-mercaptopropyl, and 3-isocyanatopropyl).

Of the groups as $R^a$ to $R^f$ in Formula (I) other than hydrogen and the monovalent group containing an aliphatic carbon-carbon unsaturated bond, preferred is straight or branched chain alkyl. This is preferred from the viewpoint of flexibility and cracking resistance of the cured product.

The monovalent group containing an aliphatic carbon-carbon unsaturated bond is exemplified by monovalent groups each containing an aliphatic carbon-carbon double bond, including alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl; alkynyl such as ethynyl and propynyl; cycloalkenyl such as cyclohexenyl; other groups containing any of the alkenyl, alkynyl, and cycloalkenyl, such as acryloyl, methacryloyl, 2-(allyloxy)ethyl, 3-(allyloxy)propyl, 2,2-bis(allyloxymethyl)butyl, and 3-allyloxy-2,2-bis(allyloxymethyl) propyl.

$R^a$ to $R^f$ in Formula (I) may be identical or different in each occurrence.

In an embodiment, at least one of $R^a$ to $R^f$ is the monovalent group containing an aliphatic carbon-carbon unsaturated bond. Formula (I) in this embodiment is also referred to as Formula (I-1). In another embodiment, at least one of $R^a$ to $R^f$ is hydrogen. Formula (I) in this embodiment is also referred to as Formula (I-2). Specifically, the polyorganosiloxysilalkylene may include a polyorganosiloxysilalkylene including a structure represented by Formula (I-1) and/or a polyorganosiloxysilalkylene including a structure represented by Formula (I-2).

In Formula (I), $R^g$ represents, independently in each occurrence, an aryl-free divalent hydrocarbon group. The aryl-free divalent hydrocarbon group is exemplified by straight or branched chain alkylene and divalent alicyclic hydrocarbon groups. The straight or branched chain alkylene is exemplified by groups represented by —$[CH_2]_t$—, where t represents an integer of 1 or more. The straight or branched chain alkylene is exemplified by $C_1$-$C_{18}$ straight or branched chain alkylene such as methylene, methylmethylene, dimethylmethylene, ethylene, propylene, and trimethylene. The divalent alicyclic hydrocarbon groups are exemplified by divalent cycloalkylene (including cycloalkylidene) such as 1,2-cyclopentylene, 1,3-cyclopentylene, cyclopentylidene, 1,2-cyclohexylene, 1,3-cyclohexylene, 1,4-cyclohexylene, and cyclohexylidene.

In Formula (I), s1 represents an integer of 1 or more. When s1 is an integer of 2 or more, two or more structures in the brackets with s1 may be identical or different. When two or more different structures are present as the structure in the brackets with s1, the structures may be attached to each other in any form not critical. Typically, the structures may be attached in a random form and/or a block form.

In Formula (I), s2 represents an integer of 1 or more. When s2 is an integer of 2 or more, two or more structures in the brackets with s2 may be identical or different. When two or more different structures are present as the structure in the brackets with s2, the structures may be attached to each other in any form not critical. Typically, the structures may be attached in a random form and/or a block form.

In Formula (I), the structure in the brackets with s1 and the structure in the brackets with s2 may be attached to each other in any form not critical. Typically, the structures may be attached in a random form and/or a block form.

The polyorganosiloxysilalkylene may contain terminal structures that are not limited, but are exemplified by silanol group, alkoxysilyl, and trialkylsilyl (e.g., trimethylsilyl). The polyorganosiloxysilalkylene may include, at its terminus or termini, a variety of groups as introduced, such as a group containing an aliphatic carbon-carbon unsaturated bond; and hydrosilyl group.

The polyorganosiloxysilalkylene represented by Formula (I) may include either a straight chain structure or a branched chain structure, as mentioned above.

In a preferred embodiment, the curable resin composition according to the present invention includes the polyorganosiloxysilalkylene that includes both a first polyorganosiloxysilalkylene and a second polyorganosiloxysilalkylene. The first polyorganosiloxysilalkylene contains an aliphatic carbon-carbon unsaturated bond in molecule. The second polyorganosiloxysilalkylene contains a hydrosilyl group in molecule. The first polyorganosiloxysilalkylene is exemplified by polyorganosiloxysilalkylenes that contain, at a terminus and/or in a side chain, a group containing an aliphatic carbon-carbon unsaturated bond, such as polyorganosiloxysilalkylenes including the structure represented by Formula (I) and containing, at a terminus and/or in a side chain, a group containing an aliphatic carbon-carbon unsaturated bond; and polyorganosiloxysilalkylenes including the structure represented by Formula (I-1). The second polyorganosiloxysilalkylene is exemplified by polyorganosiloxysilalkylenes that contain, at a terminus and/or in a side chain, hydrogen (hydrido) bonded to silicon, such as polyorganosiloxysilalkylenes including the structure represented by Formula (I) and containing, at a terminus and/or in a side chain, hydrogen bonded to silicon; and polyorganosiloxysilalkylenes including the structure represented by Formula (I-2). The curable resin composition according to this embodiment may readily give a cured product that still less undergoes yellowing due typically to heating and offers approximately no surface tack.

The curable resin composition according to the present invention may contain the polyorganosiloxysilalkylene in a proportion not critical, but preferably 60 percent by weight or more (e.g., 60 to 100 percent by weight), more preferably 80 percent by weight or more, and furthermore preferably 90 percent by weight or more, based on the total amount (100 percent by weight) of the polyorganosiloxane (A). The curable resin composition, if containing the polyorganosiloxysilalkylene in a proportion less than 60 percent by weight, may readily cause the cured product to be susceptible to yellowing and/or to have surface tack to thereby be handled unsatisfactorily.

Silsesquioxane (B)

The curable resin composition according to the present invention includes a silsesquioxane (B) that includes a ladder-like silsesquioxane as a principal component. The ladder-like silsesquioxane is a polysiloxane including a crosslinked three-dimensional structure.

Such polysiloxanes are compounds containing a backbone including siloxane bonds (Si—O—Si). The polysiloxanes may have a basic constitutional unit such as M unit, D unit, T unit, and Q unit. The M unit refers to a unit including a monovalent group containing a silicon atom bonded to one oxygen atom. The D unit refers to a unit including a divalent group containing a silicon atom bonded to two oxygen atoms. The T unit refers to a unit including a trivalent group containing a silicon atom bonded to three oxygen atoms. The Q unit refers to a unit including a tetravalent group containing a silicon atom bonded to four oxygen atoms.

The silsesquioxane is a polysiloxane including the T unit as a basic constitutional unit and is represented by an empirical formula (basic structural formula) of $RSiO_{1.5}$. The silsesquioxane includes a Si—O—Si skeleton including a structure selected typically from random structure, cage structure, and ladder structure. The ladder-like silsesquioxane is a silsesquioxane including a Si—O—Si skeleton including a ladder structure.

The ladder-like silsesquioxane for use in the present invention is represented by an empirical formula (basic structural formula) of $RSiO_{1.5}$, where R is selected from hydrogen, halogen, a monovalent organic group, a monovalent oxygen-containing group, a monovalent nitrogen-containing group, and a monovalent sulfur-containing group. At least part of multiple occurrences of R is a monovalent organic group. R in multiple occurrences may be identical or different.

The halogen as R is exemplified by fluorine, chlorine, bromine, and iodine. The monovalent organic group as R is exemplified by substituted or unsubstituted hydrocarbon groups (monovalent hydrocarbon groups), alkoxy, alkenyloxy, aryloxy, aralkyloxy, acyloxy, alkylthio, alkenylthio, arylthio, aralkylthio, carboxy, alkoxycarbonyl, aryloxycarbonyl, aralkyloxycarbonyl, epoxy, cyano, isocyanato, carbamoyl, and isothiocyanato.

The hydrocarbon groups as R are exemplified by aliphatic hydrocarbon groups, alicyclic hydrocarbon groups, aromatic hydrocarbon groups, and groups including two or more of these groups bonded to each other.

The aliphatic hydrocarbon groups as R are exemplified by alkyl, alkenyl, and alkynyl. The alkyl is exemplified by $C_1$-$C_{20}$ alkyl such as methyl, ethyl, propyl, isopropyl, butyl, hexyl, octyl, isooctyl, decyl, and dodecyl, of which $C_1$-$C_{10}$ alkyl is preferred, and $C_1$-$C_4$ alkyl is more preferred. The alkenyl is exemplified by $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl, of which $C_2$-$C_{10}$ alkenyl is preferred, and $C_2$-$C_4$ alkenyl is more preferred. The alkynyl is exemplified by $C_2$-$C_{20}$ alkynyl such as ethynyl and propynyl, of which $C_2$-$C_{10}$ alkynyl is preferred, and $C_2$-$C_4$ alkynyl is more preferred.

The alicyclic hydrocarbon groups as R are exemplified by $C_3$-$C_{12}$ cycloalkyl such as cyclopropyl, cyclobutyl, cyclopentyl, cyclohexyl, and cyclododecyl; $C_3$-$C_{12}$ cycloalkenyl such as cyclohexenyl; and $C_4$-$C_{15}$ bridged hydrocarbon groups such as bicycloheptyl and bicycloheptenyl.

The aromatic hydrocarbon groups as R are exemplified by $C_6$-$C_{14}$ aryl such as phenyl and naphthyl, of which $C_6$-$C_{10}$ aryl is preferred.

The groups, as R, each including an aliphatic hydrocarbon group and an alicyclic hydrocarbon group bonded to each other are exemplified by cyclohexylmethyl and methylcyclohexyl. The groups each including an aliphatic hydrocarbon group and an aromatic hydrocarbon group bonded to each other are exemplified by $C_7$-$C_{18}$ aralkyl such as benzyl and phenethyl, of which $C_7$-$C_{10}$ aralkyl is preferred; ($C_6$-$C_{10}$ aryl)-$C_2$-$C_6$ alkenyl such as cinnamyl; ($C_1$-$C_4$ alkyl)-substituted aryl such as tolyl; and ($C_2$-$C_4$ alkenyl)-substituted aryl such as styryl.

The hydrocarbon groups as R may each have one or more substituents. The substituents in the hydrocarbon groups may each contain carbon atoms in a number of from 0 to 20, and more preferably from 0 to 10. The substituents are exemplified by halogen such as fluorine, chlorine, bromine, and iodine; hydroxy; alkoxy such as methoxy, ethoxy, propoxy, isopropyloxy, butoxy, and isobutyloxy, of which $C_1$-$C_6$ alkoxy is preferred, and $C_1$-$C_4$ alkoxy is more preferred; alkenyloxy such as allyloxy, of which $C_2$-$C_6$ alkenyloxy is preferred, and $C_2$-$C_4$ alkenyloxy is more preferred; aryloxy optionally substituted on the aromatic ring with one or more substituents (e.g., $C_1$-$C_4$ alkyl, $C_2$-$C_4$ alkenyl, halogen, and $C_1$-$C_4$ alkoxy), such as phenoxy, tolyloxy, and naphthyloxy, of which $C_6$-$C_{14}$ aryloxy is preferred; aralkyloxy such as benzyloxy and phenethyloxy, of which $C_7$-$C_{18}$ aralkyloxy is preferred; acyloxy such as acetyloxy, propionyloxy, (meth)acryloyloxy, and benzoyloxy, of which $C_1$-$C_{12}$ acyloxy is preferred; mercapto; alkylthio such as methylthio and ethylthio, of which $C_1$-$C_6$ alkylthio is preferred, and $C_1$-$C_4$ alkylthio is more preferred; alkenylthio such as alkylthio, of which $C_2$-$C_6$ alkenylthio is preferred, and $C_2$-$C_4$ alkenylthio is more preferred; arylthio optionally substituted on the aromatic ring with one or more substituents (e.g., $C_1$-$C_4$ alkyl, $C_2$-$C_4$ alkenyl, halogen, and $C_1$-$C_4$ alkoxy), such as phenylthio, tolylthio, and naphthylthio, of which $C_6$-$C_{14}$ arylthio is preferred; aralkylthio such as benzylthio and phenethylthio, of which $C_7$-$C_{18}$ aralkylthio is preferred; carboxy; alkoxycarbonyl such as methoxycarbonyl, ethoxycarbonyl, propoxycarbonyl, and butoxycarbonyl, of which $C_1$-$C_6$ alkoxy-carbonyl is preferred; aryloxycarbonyl such as phenoxycarbonyl, tolyloxycarbonyl, and naphthyloxycarbonyl, of which ($C_6$-$C_{14}$ aryloxy)-carbonyl is preferred; aralkyloxycarbonyl such as benzyloxycarbonyl, of which ($C_7$-$C_{18}$ aralkyloxy)-carbonyl is preferred; amino; mono- or di-alkylamino such as methylamino, ethylamino, dimethylamino, and diethylamino, of which mono- or di-$C_1$-$C_6$ alkylamino is preferred; acylamino such as acetylamino, propionylamino, and benzoylamino, of which $C_1$-$C_{11}$ acylamino is preferred; epoxy-containing groups such as glycidyloxy; oxetanyl-containing groups such as ethyloxetanyloxy; acyl such as acetyl, propionyl, and benzoyl; oxo; and groups each including two or more of these groups bonded to each other, where necessary, through $C_1$-$C_6$ alkylene.

As R, the monovalent oxygen-containing group is exemplified by hydroxy, hydroperoxy, alkenyloxy, aryloxy, aralkyloxy, acyloxy, isocyanato, sulfo, and carbamoyl. The monovalent nitrogen-containing group is exemplified by amino or substituted amino (e.g., mono- or di-alkylamino and acylamino), cyano, isocyanato, isothiocyanato, and carbamoyl. The monovalent sulfur-containing group is exemplified by mercapto (thiol), sulfo, alkylthio, alkenylthio, arylthio, aralkylthio, and isothiocyanato. The above-mentioned monovalent organic groups, monovalent oxygen-containing groups, monovalent nitrogen-containing groups, and monovalent sulfur-containing groups may overlap one another.

The group R is further exemplified by a group represented by Formula (4):

[Chem. 7]

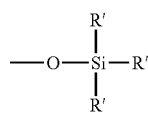

(4)

In Formula (4), multiple occurrences of R' may be identical or different. R' in Formula (4) is, independently in each occurrence, selected from hydrogen, halogen, a monovalent organic group, a monovalent oxygen-containing group, a monovalent nitrogen-containing group, and a monovalent sulfur-containing group. These groups are exemplified as with the groups as R.

R' in the group represented by Formula (4) is, independently in each occurrence, preferably selected from hydrogen, $C_1$-$C_{10}$ alkyl (of which $C_1$-$C_4$ alkyl is preferred), $C_2$-$C_{10}$ alkenyl (of which $C_2$-$C_4$ alkyl is preferred), $C_3$-$C_{12}$ cycloalkyl, $C_3$-$C_{12}$ cycloalkenyl, $C_6$-$C_{14}$ aryl optionally substituted on the aromatic ring with one or more substituents (e.g., $C_1$-$C_4$ alkyl, $C_2$-$C_4$ alkenyl, halogen, and $C_1$-$C_4$ alkoxy), $C_7$-$C_{18}$ aralkyl, ($C_6$-$C_{10}$ aryl)-$C_2$-$C_6$ alkenyl, hydroxy, $C_1$-$C_6$ alkoxy, and halogen.

Among them, R is preferably selected from hydrogen and substituted or unsubstituted hydrocarbon groups, is more preferably selected from substituted or unsubstituted hydrocarbon groups, furthermore preferably selected from aliphatic hydrocarbon groups (of which alkyl or alkenyl is preferred) and aromatic hydrocarbon groups (of which phenyl is preferred).

The ladder-like silsesquioxane for use in the present invention is represented typically by Formula (5):

[Chem. 8]

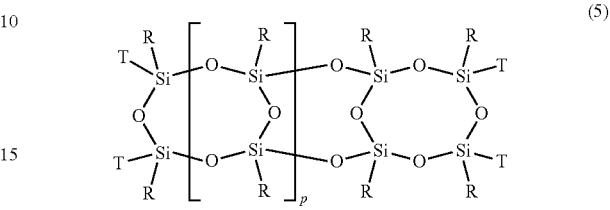

(5)

In Formula (5), p represents an integer of 1 or more and is preferably from 1 to 5000, more preferably from 1 to 2000, and furthermore preferably from 1 to 1000. In Formula (5), R represents as with the group R and hereinafter also referred to as a "side chain"; and T represents a terminal group. T is exemplified as with R.

R in multiple occurrences may include substituted or unsubstituted hydrocarbon groups in a proportion not critical, but preferably 50 mole percent or more, more preferably 80 mole percent or more, and furthermore preferably 90 mole percent or more, based on the total amount (100 mole percent) of all occurrences of R. In particular, R in multiple occurrences preferably includes a group or groups selected from substituted or unsubstituted alkyl (preferably $C_1$-$C_{10}$ alkyl, and more preferably $C_1$-$C_4$ alkyl such as methyl or ethyl), substituted or unsubstituted aryl (preferably $C_6$-$C_{10}$ aryl, and particularly preferably phenyl), substituted or unsubstituted $C_7$-$C_{10}$ aralkyl (preferably $C_7$-$C_{10}$ aralkyl, and particularly preferably benzyl) in a total amount of 50 mole percent or more, more preferably 80 mole percent or more, and furthermore preferably 90 mole percent or more, based on the total amount (100 mole percent) of all occurrences of R. In particular, part or all of the multiple occurrences of R are preferably substituted or unsubstituted aryl. This is preferred so as to allow the cured product to have superior barrier properties to a corrosive gas. Specifically, the ladder-like silsesquioxane is preferably one containing at least substituted or unsubstituted aryl in molecule.

The silsesquioxane (B) for use in the present invention may have a number-average molecular weight and/or a weight-average molecular weight not critical, but preferably from 100 to 800000, more preferably from 200 to 100000, furthermore preferably from 300 to 30000, and particularly preferably from 500 to 20000. The silsesquioxane (B), if having a molecular weight less than 100, may cause the cured product to have lower heat resistance. In contrast, the silsesquioxane (B), if having a molecular weight greater than 800000, may have lower compatibility with another component. The silsesquioxane (B) may be a mixture including silsesquioxanes having different molecular weights within the range. The number-average molecular weight and/or weight-average molecular weight may be calculated typically as a molecular weight determined by gel permeation chromatography and calibrated with a polystyrene standard.

The silsesquioxane (B), in particular the ladder-like silsesquioxane, for use in the present invention may be produced by a known production process such as hydrolytic condensation using a trifunctional silane compound as a starting material.

The curable resin composition according to the present invention may include each of different silsesquioxanes alone or in combination as the silsesquioxane (B).

The curable resin composition according to the present invention may contain the silsesquioxane (B) in a content (amount) not critical, but preferably from 5 to 45 percent by weight, more preferably from 7 to 40 percent by weight, and furthermore preferably from 10 to 35 percent by weight, based on the total amount (100 percent by weight) of the curable resin composition. The curable resin composition, if containing the silsesquioxane (B) in a content less than 5 percent by weight, may fail to allow the cured product to have sufficient gas barrier properties to a corrosive gas such as SOx. In contrast, the curable resin composition, if containing the silsesquioxane (B) in a content greater than 45 percent by weight, may cause the cured product to have inferior cracking resistance and/or lower heat resistance.

Ladder-Like Silsesquioxane (B1)

The curable resin composition according to the present invention may include a ladder-like silsesquioxane (B1) as the silsesquioxane (B). The "ladder-like silsesquioxane (B1)" refers to a ladder-like silsesquioxane containing an aliphatic carbon-carbon double bond in molecule. The ladder-like silsesquioxane (B1) is not limited, as long as being a compound that contains, in the side chain or at the terminal group, a group containing an aliphatic carbon-carbon double bond.

The group containing an aliphatic carbon-carbon double bond is exemplified by $C_2$-$C_{20}$ alkenyl such as vinyl, allyl, methallyl, 1-propenyl, isopropenyl, 1-butenyl, 2-butenyl, 3-butenyl, 1-pentenyl, 2-pentenyl, 3-pentenyl, 4-pentenyl, and 5-hexenyl, of which $C_2$-$C_{10}$ alkenyl is preferred, and $C_2$-$C_4$ alkenyl is more preferred; $C_3$-$C_{12}$ cycloalkenyl such as cyclohexenyl; $C_4$-$C_{15}$ bridged unsaturated hydrocarbon groups such as bicycloheptenyl; ($C_2$-$C_4$ alkenyl)-substituted aryl such as styryl; and cinnamyl. The group containing an aliphatic carbon-carbon double bond is also exemplified by the groups represented by Formula (4), in which at least one of three occurrences of R' is a group selected from the above-mentioned groups such as $C_2$-$C_{20}$ alkenyl, $C_3$-$C_{12}$ cycloalkenyl, $C_4$-$C_{15}$ bridged unsaturated hydrocarbon groups, ($C_2$-$C_4$ alkenyl)-substituted aryl, and cinnamyl. Among them, alkenyl is preferred, $C_2$-$C_{20}$ alkenyl is more preferred, and vinyl is furthermore preferred.

The ladder-like silsesquioxane (B1) may contain the aliphatic carbon-carbon double bond in a number in molecule (per molecule) not critical, but preferably 2 or more (e.g., from 2 to 50), and more preferably from 2 to 30. The ladder-like silsesquioxane (B1), when containing the aliphatic carbon-carbon double bond in a number within the range, may readily contribute to the formation of a cured product that has excellent heat resistance and other physical properties, cracking resistance, and barrier properties to a corrosive gas.

The ladder-like silsesquioxane (B1) may contain the aliphatic carbon-carbon double bond in a content not critical, but preferably from 0.7 to 5.5 mmol/g, and more preferably from 1.1 to 4.4 mmol/g. The ladder-like silsesquioxane (B1) may contain the aliphatic carbon-carbon double bond in a proportion (by weight) not critical, but preferably from 2.0 to 15.0 percent by weight, and more preferably from 3.0 to 12.0 percent by weight, in terms of vinyl.

Though not limited, the ladder-like silsesquioxane (B1) is preferably liquid at room temperature (about 25° C.). More specifically, the ladder-like silsesquioxane (B1) may have a viscosity at 23° C. of preferably from 100 to 100000 mPa·s, more preferably from 500 to 10000 mPa·s, and furthermore preferably from 1000 to 8000 mPa·s. The ladder-like silsesquioxane (B1), if having a viscosity less than 100 mPa·s, may cause the cured product to have lower heat resistance. In contrast, the ladder-like silsesquioxane (B1), if having a viscosity greater than 100000 mPa·s, may cause the curable resin composition to be prepared and/or to be handled with difficulty. The viscosity at 23° C. may be measured typically with a rheometer (trade name Physica UDS-200, supplied by Anton Paar GmbH) and a cone-and-plate (with a cone diameter of 16 mm at a taper angle of 0°) at a temperature of 23° C. and a number of revolutions of 20 rpm.

Ladder-Like Silsesquioxane (B2)

The curable resin composition according to the present invention may include a ladder-like silsesquioxane (B2) as the silsesquioxane (B). The "ladder-like silsesquioxane (B2)" refers to a silsesquioxane containing a Si—H bond in molecule. The ladder-like silsesquioxane (B2) is not limited, as long as being a compound containing, in the side chain or at the terminal group, hydrogen and/or a group containing a Si—H bond.

The group containing a Si—H bond is exemplified by, but not limited to, the groups represented by Formula (4) in which at least one of three occurrences of R' is hydrogen.

The ladder-like silsesquioxane (B2) may contain the hydrogen and/or the group containing a Si—H bond in a number in molecule (per molecule) not critical, but preferably 2 or more (e.g., from 2 to 50), and more preferably from 2 to 30. The ladder-like silsesquioxane (B2), when containing the hydrogen and/or the group containing a Si—H in a number within the range, may contribute to better heat resistance of the cured product derived from the curable resin composition.

The ladder-like silsesquioxane (B2) may contain the hydrogen and/or the group containing a Si—H bond in a content not critical, but preferably from 0.01 to 0.50 mmol/g, and more preferably from 0.08 to 0.28 mmol/g. The ladder-like silsesquioxane (B2) may contain the hydrogen and/or the group containing a Si—H bond in a proportion (by weight) not critical, but preferably from 0.01 to 0.50 percent by weight, and more preferably from 0.08 to 0.28 percent by weight in terms of H. The term "in terms of H" refers to "in terms of weight of hydrogen or H (hydrido) in the Si—H bond". The ladder-like silsesquioxane (B2), if containing the hydrogen and/or the group containing a Si—H bond in an excessively low content (e.g., less than 0.01 mmol/g, or less than 0.01 percent by weight in terms of H), may cause the curable resin composition to be cured insufficiently. In contrast, the ladder-like silsesquioxane (B2), if containing the hydrogen and/or the group containing a Si—H bond in an excessively high content (e.g., greater than 0.50 mmol/g, or greater than 0.50 percent by weight in terms of H), may cause the cured product to have excessively high hardness (to be excessively rigid) and to be susceptible to fracture. The content of the hydrogen and/or the group containing a Si—H bond in the ladder-like silsesquioxane (B2) may be measured typically by $^1$H-NMR.

The ladder-like silsesquioxane (B2) may contain the group containing a Si—H bond in a content not critical, but preferably from 50 to 100 mole percent, and more preferably from 80 to 100 mole percent, based on the total amount (100 mole percent) of the hydrogen and/or the group containing a Si—H bond in the ladder-like silsesquioxane (B2). This is preferred from the viewpoint of degree of cure.

Though not limited, the ladder-like silsesquioxane (B2) is preferably liquid at room temperature (about 25° C.). More specifically, the ladder-like silsesquioxane (B2) may have a viscosity of preferably from 100 to 100000 mPa·s, more preferably from 500 to 10000 mPa·s, and furthermore preferably from 1000 to 8000 mPa·s at 23° C. The ladder-like silsesquioxane (B2), if having a viscosity less than 100 mPa·s, may cause the cured product to have lower heat resistance. In contrast, the ladder-like silsesquioxane (B2), if having a viscosity greater than 100000 mPa·s, may cause the curable resin composition to be prepared and/or to be handled with difficulty. The viscosity at 23° C. may be measured typically by a similar procedure to the measurement of the viscosity of the ladder-like silsesquioxane (B1).

The curable resin composition according to the present invention may contain the ladder-like silsesquioxane (B1) and the ladder-like silsesquioxane (B2) in a proportion (in a total amount) not critical, but preferably 60 percent by weight or more (e.g., 60 to 100 percent by weight), more preferably 80 percent by weight or more, and furthermore preferably 90 percent by weight or more, based on the total amount (100 percent by weight) of the silsesquioxane (B). The curable resin composition, if containing the ladder-like silsesquioxane (B1) and the ladder-like silsesquioxane (B2) in a total proportion less than 60 percent by weight, may readily cause the cured product to have lower barrier properties to a corrosive gas.

Other Ladder-Like Silsesquioxanes

The curable resin composition according to the present invention may also include, as the ladder-like silsesquioxane, one or more other ladder-like silsesquioxanes. The term "other ladder-like silsesquioxane(s)" refers to ladder-like silsesquioxane(s) other than the ladder-like silsesquioxane (B1) and the ladder-like silsesquioxane (B2). In particular, the curable resin composition may preferably include the other ladder-like silsesquioxane(s) in combination with the ladder-like silsesquioxane (B1) and/or the ladder-like silsesquioxane (B2). In particular, preferred examples of the other ladder-like silsesquioxanes include a ladder-like silsesquioxane (S1) and a ladder-like silsesquioxane (S2). The "ladder-like silsesquioxane (S1)" refers to a ladder-like silsesquioxane that is solid at 25° C. and contains an aliphatic carbon-carbon double bond. The "ladder-like silsesquioxane (S2)" refers to a ladder-like silsesquioxane that is solid at 25° C. and contains a hydrosilyl group. In an embodiment, the curable resin composition according to the present invention includes the ladder-like silsesquioxane (S1) and/or (S2). In particular in this embodiment, the curable resin composition may give, upon curing, a cured product that has better barrier properties to a corrosive gas and better toughness (in particular, cracking resistance).

Isocyanurate Compound (C)

The curable resin composition according to the present invention includes an isocyanurate compound (C). The curable resin composition according to the present invention, particularly as including the isocyanurate compound (C), may readily give, upon curing, a cured product that has better barrier properties to a corrosive gas and better adhesion to an adherend. In particular, the curable resin composition preferably includes the isocyanurate compound represented by Formula (1) as the isocyanurate compound (C).

In Formula (1), $R^x$, $R^y$, and $R^z$ are each, identically or differently, selected from the group represented by Formula (2) and the group represented by Formula (3). In particular, at least one (preferably one or two, more preferably one) of $R^x$, $R^y$, and $R^z$ in Formula (1) is preferably the group represented by Formula (3).

In Formulae (2) and (3), $R^1$ and $R^2$ are each, identically or differently, selected from hydrogen and $C_1$-$C_8$ straight or branched chain alkyl. The $C_1$-$C_8$ straight or branched chain alkyl is exemplified by methyl, ethyl, propyl, isopropyl, butyl, isobutyl, s-butyl, pentyl, hexyl, heptyl, octyl, and ethylhexyl. Of the alkyl, preferred is $C_1$-$C_3$ straight or branched chain alkyl such as methyl, ethyl, propyl, and isopropyl. $R^1$ and $R^2$ in Formulae (2) and (3) are each particularly preferably hydrogen.

The isocyanurate compound (C) is exemplified by, but not limited to, monoallyl dimethyl isocyanurate, diallyl monomethyl isocyanurate, triallyl isocyanurate, monoallyl diglycidyl isocyanurate, diallyl monoglycidyl isocyanurate, triglycidyl isocyanurate, monomethyl diglycidyl isocyanurate, dimethyl monoglycidyl isocyanurate, 1-allyl-3,5-bis(2-methylepoxypropyl) isocyanurate, 1-(2-methylpropenyl)-3,5-diglycidyl isocyanurate, 1-(2-methylpropenyl)-3,5-bis(2-methylepoxypropyl) isocyanurate, 1,3-diallyl-5-(2-methylepoxypropyl) isocyanurate, 1,3-bis(2-methylpropenyl)-5-glycidyl isocyanurate, 1,3-bis(2-methylpropenyl)-5-(2-methylepoxypropyl) isocyanurate, and tris(2-methylpropenyl) isocyanurate. The curable resin composition may include each of different isocyanurate compounds alone or in combination as the isocyanurate compound (C).

The isocyanurate compound (C) may be mixed with the silane coupling agent (D) before being mixed with other components as described later. This is performed for better compatibility with the other components.

The curable resin composition may contain the isocyanurate compound (C) in a content not critical, but preferably from 0.01 to 10 percent by weight, more preferably from 0.05 to 5 percent by weight, and furthermore preferably from 0.1 to 3 percent by weight, based on the total amount (100 percent by weight) of the curable resin composition. The curable resin composition, if containing the isocyanurate compound (C) in a content less than 0.01 percent by weight, may cause the cured product to have lower barrier properties to a corrosive gas and lower adhesion to an adherend. In contrast, the curable resin composition, if containing the isocyanurate compound (C) in a content greater than 10 percent by weight, may suffer from precipitation of solids or may cause the cured product to be cloudy.

Silane Coupling Agent (D)

The curable resin composition according to the present invention includes a silane coupling agent (D). The curable resin composition according to the present invention, as including the silane coupling agent (D), may readily give, upon curing, a cured product that has better barrier properties to a corrosive gas and, in particular, better adhesion to an adherend.

The silane coupling agent (D) has good compatibility with components such as the silsesquioxane (B) and the isocyanurate compound (C). Typically, for better compatibility of the isocyanurate compound (C) with other components, the isocyanurate compound (C) may be blended beforehand with the silane coupling agent (D) to give a composition, and the composition may be blended with the other components. This may readily give a homogeneous curable resin composition.

The silane coupling agent (D) may be selected from known or common silane coupling agents without limitation, but is exemplified by epoxy-containing silane coupling agents such as 3-glycidoxypropyltrimethoxysilane, 2-(3,4- epoxycyclohexyl)ethyltrimethoxysilane, 3-glycidoxypropyl-methyldiethoxysilane, and 3-glycidoxypropyltriethoxysilane; amino-containing silane coupling agents such as N-2-(aminoethyl)-3-aminopropylmethyldimethoxysilane, N-2-(aminoethyl)-3-aminopropyltrimethoxysilane, N-2-(aminoethyl)-3-aminopropyltriethoxysilane, 3-aminopropyltrimethoxysilane, 3-aminopropyltriethoxysilane, 3-triethoxysilyl-N-(1,3-dimethyl-butylidene)propylamine, N-phenyl-3-aminopropyltrimethoxysilane, N-(vinylbenzyl)-2-aminoethyl-3-aminopropyltrimethoxysilane hydrochloride, and N-(β-aminoethyl)-γ-aminopropylmethyldiethoxysilane; and other silane coupling agents such as tetramethoxysilane, tetraethoxysilane, methyltriethoxysilane, dimethyldiethoxysilane, methyltriethoxysilane, vinyltriethoxysilane, vinyltrimethoxysilane, vinyltris(methoxyethoxysilane), phenyltrimethoxysilane, diphenyldimethoxysilane, vinyltriacetoxysilane, γ-(meth)acryloxypropyltriethoxysilane, γ-(meth)acryloxypropyltrimethoxysilane, γ-(meth)acryloxypropylmethyldimethoxysilane, γ-(meth)acryloxypropylmethyldiethoxysilane, mercaptopropylenetrimethoxysilane, and mercaptopropylenetriethoxysilane. Among them, epoxy-containing silane coupling agents are preferred, of which 3-glycidoxypropyltrimethoxysilane is particularly preferred. The curable resin composition may include each of different silane coupling agents alone or in combination as the silane coupling agent (D).

The curable resin composition may contain the silane coupling agent (D) in a content not critical, but preferably from 0.01 to 15 percent by weight, more preferably from 0.1 to 10 percent by weight, and furthermore preferably from 0.5 to 5 percent by weight, based on the total amount (100 percent by weight) of the curable resin composition. The curable resin composition, if containing the silane coupling agent (D) in a content less than 0.01 percent by weight, may cause the cured product to have lower adhesion to an adherend. In particular, when the silane coupling agent (D) is mixed beforehand with the isocyanurate compound (C), this curable resin composition may fail to allow the cured product to have sufficient effects (barrier properties to a corrosive gas). In contrast, the curable resin composition, if containing the silane coupling agent (D) in a content greater than 15 percent by weight, may undergo lower curing to cause the cured product to have lower toughness, heat resistance, and barrier properties.

Hydrosilylation Catalyst

The curable resin composition according to the present invention may further include a hydrosilylation catalyst. The curable resin composition according to the present invention, when including the hydrosilylation catalyst, allows a curing reaction (hydrosilylation) to proceed efficiently. The hydrosilylation catalyst is exemplified by known catalysts for hydrosilylation, such as platinum catalysts, rhodium catalysts, and palladium catalysts. Specifically, the hydrosilylation catalyst is exemplified by platinum catalysts including fine platinum powder, platinum black, platinum carried on fine silica powder, platinum carried on activated carbon, chloroplatinic acid, complexes of chloroplatinic acid typically with an alcohol, an aldehyde, or a ketone, platinum-olefin complexes, platinum-carbonyl complexes (e.g., platinum-carbonylvinylmethyl complex), platinum-vinylmethylsiloxane complexes (e.g., platinum-divinyltetramethyldisiloxane complex and platinum-cyclovinylmethylsiloxane complex), platinum-phosphine complexes, and platinum-phosphite complexes. The hydrosilylation catalyst is further exemplified by palladium catalysts and rhodium catalysts corresponding to the platinum catalysts, except for respectively containing palladium and rhodium instead of platinum. The curable resin composition may include each of different hydrosilylation catalysts alone or in combination as the hydrosilylation catalyst.

The curable resin composition according to the present invention may contain the hydrosilylation catalyst in a content not critical, but typically in such an amount that the amount of platinum, palladium, or rhodium in the hydrosilylation catalyst is preferably from 0.01 to 1,000 ppm by weight, and more preferably from 0.1 to 500 ppm by weight. The curable resin composition, when containing the hydrosilylation catalyst in a content within the range, may not suffer from a remarkably low crosslinking rate and may less cause the cured product to suffer from troubles such as coloration, thus being preferred.

Hydrosilylation Inhibitor

The curable resin composition according to the present invention may further include a hydrosilylation inhibitor so as to control the curing reaction (hydrosilylation) rate. The hydrosilylation inhibitor is exemplified by alkyne alcohols such as 3-methyl-1-butyn-3-ol, 3,5-dimethyl-1-hexyn-3-ol, and phenylbutynol; ene-yne compounds such as 3-methyl-3-penten-1-yne and 3,5-dimethyl-3-hexen-1-yne; and other compounds such as thiazole, benzothiazole, and benzotriazole. The curable resin composition may include each of different hydrosilylation inhibitors alone or in combination as the hydrosilylation inhibitor. The curable resin composition may contain the hydrosilylation inhibitor in a content practically preferably from 0.00001 to 5 percent by weight, although the content may vary depending on crosslinking conditions of the curable resin composition.

Other Siloxane Compounds

The curable resin composition according to the present invention may further include, as another silane compound, a cyclic siloxane containing two or more aliphatic carbon-carbon double bonds in molecule (per molecule). The curable resin composition according to the present invention may also include, as another siloxane compound, a cyclic siloxane containing two or more groups containing a Si—H bond in molecule (per molecule). The curable resin composition may include each of different cyclic siloxanes alone or in combination. The curable resin composition according to the present invention may contain the cyclic siloxane(s) in a content (amount) not critical, but preferably from 0.01 to 30 percent by weight, more preferably from 0.1 to 20 percent by weight, and furthermore preferably from 0.5 to 10 percent by weight, based on the total amount (100 percent by weight) of the curable resin composition.

Other Silane Compounds

The curable resin composition according to the present invention may include another silane compound such as a hydrosilyl-containing compound. The other silane compound is exemplified by Si—H-containing straight or branched chain siloxanes such as methyl(trisdimethylsiloxy)silane, tetrakis(dimethylsiloxy)silane, 1,1,3,3-tetramethyldisiloxane, 1,1,3,3,5,5-hexamethyltrisiloxane, 1,1,1,3,5,5,5-heptamethyltrisiloxane, 1,1,3,3,5,5,7,7-octamethyltetrasiloxane, 1,1,1,3,5,5,7,7,7-nonamethyltetrasiloxane, 1,1,3,3,5,5,7,7,9,9-decamethylpentasiloxane, and 1,1,1,3,5,5,7,7,9,9,9-undecamethylpentasiloxane. The curable resin composition may include each of different silane compounds alone or in combination as the other silane compound. The curable resin composition may contain the other silane compound in a content not critical, but preferably from 0 to 5 percent by weight, and more preferably from 0 to 1.5 percent by weight, based on the total amount (100 percent by weight) of the curable resin composition.

Solvent

The curable resin composition according to the present invention may include a solvent. The solvent is exemplified by customarily known solvents such as toluene, hexane, isopropyl alcohol, methyl isobutyl ketone, cyclopentanone, and propylene glycol monomethyl ether acetate. The curable resin composition may include each of different solvents alone or in combination.

Additives

The curable resin composition according to the present invention may further include one or more common additives as other optional components. The additives are exemplified by fillers including inorganic fillers such as precipitated silica, hydrous silica (wet silica), fumed silica, pyrogenic silica, titanium oxides, alumina, glass, quartz, aluminosilicates, iron oxides, zinc oxide, calcium carbonate, carbon black, silicon carbide, silicon nitride, and boron nitride, and inorganic fillers prepared by treating these fillers with organosilicon compounds such as organohalosilanes, organoalkoxysilanes, and organosilazanes; fine powders of organic resins such as silicone resins, epoxy resins, and fluorocarbon resins; and conductive powders of metals such as silver and copper. The additives are further represented by stabilizers such as antioxidants, ultraviolet absorbers, photostabilizers, and thermal stabilizers; flame retardants such as phosphorus flame retardants, halogen flame retardants, and inorganic flame retardants; flame retardant promoters; reinforcing materials such as other fillers; nucleating agents; coupling agents; lubricants; waxes; plasticizers; mold release agents; impact modifiers; hue modifiers; flow improvers; colorants such as dyestuffs and pigments; dispersing agents; antifoaming agents; defoaming agents; antimicrobial agents; antiseptic agents (preservatives); viscosity modifiers; and thickeners. The curable resin composition may include each of different additives alone or in combination.

Curable Resin Composition

The curable resin composition according to the present invention may have a formulation (blending formulation) not critical, but preferably such a formulation that the aliphatic carbon-carbon double bond is present in a proportion of preferably from 0.2 to 4 moles, more preferably from 0.5 to 1.5 moles, and furthermore preferably from 0.8 to 1.2 moles, per mole of the hydrosilyl group present in the curable resin composition. Control of the proportions of the hydrosilyl group and the aliphatic carbon-carbon double bond within the range may readily allow the cured product to have still better heat resistance, transparency, flexibility, reflow resistance, and barrier properties to a corrosive gas.

The curable resin composition according to the present invention may be prepared typically, but not limitatively, by stirring and mixing the components at room temperature. The curable resin composition according to the present invention can be used as a one-part composition or a multi-part (e.g., two-part) composition. The one-part composition is prepared by mixing the individual components in advance and is used as intact. The multi-part composition is prepared as two or more components stored separately and is used after mixing them in predetermined proportions.

Though not limited, the curable resin composition according to the present invention is preferably liquid at room temperature (about 25° C.). More specifically, the curable resin composition according to the present invention may have a viscosity of from 300 to 20000 mPa·s, more preferably from 500 to 10000 mPa·s, and furthermore preferably from 1000 to 8000 mPa·s at 23° C. The curable resin composition, if having a viscosity less than 300 mPa·s, may cause the cured product to have lower heat resistance. In contrast, the curable resin composition, if having a viscosity greater than 20000 mPa·s, may be prepared and/or handled with difficulty and may cause air bubbles to readily remain in the cured product. The viscosity of the curable resin composition may be measured by a procedure similar to the measurement of the viscosity of the ladder-like silsesquioxane (B1).

Cured Product

The curable resin composition according to the present invention, when cured by a curing reaction (hydrosilylation), gives a cured product. This cured product is hereinafter also referred to as "cured product according to the present invention". The curing reaction may be performed under conditions that are not critical and selectable from customarily known conditions as appropriate. Typically from the viewpoint of reaction rate, the curing reaction is preferably performed at a temperature (curing temperature) of from 25° C. to 180° C. (more preferably from 60° C. to 150° C.) for a time (curing time) of from 5 to 720 minutes. The cured product according to the present invention has excellent physical properties such as heat resistance, transparency, and flexibility, still offers superior reflow resistance such as cracking resistance and package adhesion in a reflow process, and has superior barrier properties to a corrosive gas such as a SOx gas.

Encapsulating Agent

The encapsulating agent according to the present invention is an encapsulating agent including the curable resin composition according to the present invention as an essential component. The encapsulating agent according to the present invention, when cured, gives an encapsulant (cured product). The encapsulant has excellent physical properties such as heat resistance, transparency, and flexibility and still offers superior reflow resistance and barrier properties to a corrosive gas. The encapsulating agent according to the present invention is preferably usable as an encapsulating agent for a semiconductor element in a semiconductor device. In particular, the encapsulating agent is preferably usable typically as an encapsulating agent for an optical semiconductor element (in particular, for a high-brightness and short-wavelength optical semiconductor element) in an optical semiconductor device. The encapsulating agent according to the present invention, when used to encapsulate a semiconductor element, gives a semiconductor device that has excellent durability and quality. In particular, the encapsulating agent, when used to encapsulate an optical semiconductor element, give an optical semiconductor device that has excellent durability and quality.

EXAMPLES

The present invention will be illustrated in further detail with reference to several examples below. It should be noted, however, that the examples are by no means intended to limit the scope of the present invention.

Reaction products and commercial products were subjected to $^1$H-NMR analysis using JEOL ECA500 (500 MHz). The reaction products and the commercial products were also subjected to number-average molecular weight and weight-average molecular weight measurements using Alliance HPLC System 2695 (supplied by Waters Corporation), Refractive Index Detector 2414 (supplied by Waters Corporation), two Tskgel GMH$^{HR}$-M columns (supplied by Tosoh Corporation) as columns, a Tskgel guardcolumn $H^{HR}L$ (supplied by Tosoh Corporation) as a guard column, COLUMN HEATER U-620 (supplied by Sugai) as a column oven, and THF as a solvent at a measurement temperature of 40° C.

Polyorganosiloxane (A)

Polyorganosiloxanes (A) used herein were commercial products as follows:

GD-1012A: Product supplied by Eternal Chemical Co., Ltd., having a vinyl content of 1.33 percent by weight, a phenyl content of 0 percent by weight, a SiH content (in terms of hydrido) of 0 percent by weight, a number-average molecular weight of 5108, and a weight-average molecular weight of 23385

GD-1012B: Product supplied by Eternal Chemical Co., Ltd., having a vinyl content of 1.65 percent by weight, a phenyl content of 0 percent by weight, a SiH content (in terms of hydrido) of 0.19 percent by weight, a number-average molecular weight of 4563, and a weight-average molecular weight of 21873

KER-2500A: Product supplied by Shin-Etsu Chemical Co., Ltd., having a vinyl content of 1.53 percent by weight, a phenyl content of 0 percent by weight, a SiH content (in terms of hydrido) of 0.03 percent by weight, a number-average molecular weight of 4453, and a weight-average molecular weight of 19355

KER-2500B: Product supplied by Shin-Etsu Chemical Co., Ltd., having a vinyl content of 1.08 percent by weight, a phenyl content of 0 percent by weight, a SiH content (in terms of hydrido) of 0.13 percent by weight, a number-average molecular weight of 4636, and a weight-average molecular weight of 18814

Silsesquioxane (B) Synthesis

Synthesis Example 1

In a reactor were charged 30.06 g of methyltriethoxysilane (supplied by Shin-Etsu Chemical Co., Ltd.), 21.39 g of vinyltriethoxysilane (supplied by Tokyo Chemical Industry Co., Ltd.), and 17.69 g of methyl isobutyl ketone (MIBK), and the mixture of them was cooled down to 10° C. The mixture was combined with 281 mmol (5.06 g) of water and 0.48 g (2.4 mmol in terms of hydrogen chloride) of 5 N hydrochloric acid each added dropwise over one hour. After the dropwise addition, the mixture of them was held at 10° C. for one hour. The reaction mixture was then diluted with 80.0 g of MIBK.

Next, the reactor temperature was raised to 70° C. At the time point when the temperature reached 70° C., the mixture was combined with 703 mmol (12.64 g) of water, followed by a polycondensation reaction in a nitrogen atmosphere for 12 hours.

The reaction mixture was then combined with 15.0 g of hexamethyldisiloxane, followed by a silylation reaction at 70° C. for 3 hours. The reaction mixture was cooled, washed with water until the lower layer liquid became neutral, and the upper layer liquid was then separated. After distilling off the solvent therefrom at 60° C. and 1 mmHg, the upper layer liquid yielded 22.0 g of a ladder-like silsesquioxane containing a terminal trimethylsilyl group as a colorless, transparent solid product.

The ladder-like silsesquioxane had a weight-average molecular weight (Mw) of 5000, a vinyl content (average content) per molecule of 11.68 percent by weight, and a ratio (molar ratio) of methyl to vinyl of 60:40.

The ladder-like silsesquioxane had a $^1$H-NMR spectrum as follows:

$^1$H-NMR (JEOL ECA500 (500 MHz, CDCl$_3$)) δ: 0-0.3 ppm (br), 5.8-6.1 ppm (br)

Synthesis Example 2

In a reactor were charged 34.07 g of methyltriethoxysilane, 11.49 g of phenyltriethoxysilane (supplied by Shin-Etsu Chemical Co., Ltd.), and 17.69 g of methyl isobutyl ketone (MIBK), and the mixture of them was cooled down to 10° C. The mixture was combined with 240 mmol (4.33 g) of water and 0.48 g (2.4 mmol in terms of hydrogen chloride) of 5 N hydrochloric acid each added dropwise over one hour. After the dropwise addition, the mixture of them was held at 10° C. for one hour. The reaction mixture was then diluted with 80.0 g of MIBK.

Next, the reactor temperature was raised to 70° C. At the time point when the temperature reached 70° C., the reaction mixture was combined with 606 mmol (10.91 g) of water, followed by a polycondensation reaction in a nitrogen atmosphere for 9 hours. The mixture was further combined with 6.25 g of vinyltriethoxysilane, followed by a reaction for 3 hours.

Subsequently, the reaction mixture was combined with 15.0 g of hexamethyldisiloxane, followed by a silylation reaction at 70° C. for 3 hours. The reaction mixture was then cooled, washed with water until the lower layer liquid became neutral, and the upper layer liquid was separated. After distilling off the solvent therefrom at 60° C. and 1 mmHg, the upper layer liquid yielded a ladder-like silsesquioxane containing a terminal vinyl group and a terminal trimethylsilyl group as a colorless, transparent liquid product. This corresponds to the ladder-like silsesquioxane (B1).

The ladder-like silsesquioxane had a weight-average molecular weight (Mw) of 3400, a vinyl content (average content) per molecule of 3.96 percent by weight, and a ratio (molar ratio) of phenyl to methyl to vinyl of 17:68:15.

The ladder-like silsesquioxane had a $^1$H-NMR spectrum as follows:

$^1$H-NMR (JEOL ECA500 (500 MHz, CDCl$_3$)) δ: −0.3-0.3 ppm (br), 5.7-6.2 ppm (br), 7.1-7.7 ppm (br)

Synthesis Example 3

In a reactor were charged 31.06 g of methyltriethoxysilane, 2.38 g of phenyltriethoxysilane, and 93.00 g of methyl isobutyl ketone (MIBK), and the mixture of them was cooled down to 10° C. The mixture was combined with 240 mmol (4.33 g) of water and 0.24 g (1.2 mmol in terms of hydrogen chloride) of 5 N hydrochloric acid each added dropwise over one hour. After the dropwise addition, the mixture of them was held at 10° C. for one hour.

Next, the reactor temperature was raised to 50° C. At the time point when the temperature reached 50° C., the mixture was combined with 120 mmol (2.16 g) of water, followed by a polycondensation reaction in a nitrogen atmosphere for 4 hours. The mixture was further combined with 11.18 g of vinyltriethoxysilane, followed by a reaction for 4 hours.

Subsequently, the reaction mixture was combined with 19.5 g of hexamethyldisiloxane, followed by a silylation reaction at 50° C. for one hour. The reaction mixture was then cooled, washed with water until the lower layer liquid became neutral, and the upper layer liquid was separated. After distilling off the solvent therefrom at 60° C. and 1 mmHg, the upper layer liquid yielded a ladder-like silsesquioxane containing a terminal vinyl group and a terminal trimethylsilyl group as a colorless, transparent liquid product. This corresponds to the ladder-like silsesquioxane (B1).

The ladder-like silsesquioxane had a number-average molecular weight (Mn) of 879 and a weight-average molecular weight (Mw) of 1116.

Synthesis Example 4

In a reactor were charged 12 g of the ladder-like silsesquioxane obtained in Synthesis Example 2, 24 g of 1,1,3,3-tetramethyldisiloxane (supplied by Tokyo Chemical Industry Co., Ltd.), and 10 μl of a 2.0% platinum-cyclovinylsiloxane complex vinylcyclosiloxane solution (supplied by Wako Pure Chemical Industries, Ltd.). The mixture of them was heated at 70° C. for 8 hours, and the reaction was completed. The reaction mixture was then concentrated on an evaporator, decompressed to 0.2 Torr for 3 hours using a vacuum pump, and yielded a ladder-like silsesquioxane containing a terminal SiH-containing group and a terminal trimethylsilyl group as a liquid product. This corresponds to the ladder-like silsesquioxane (B2).

The ladder-like silsesquioxane had a weight-average molecular weight (Mw) of 3700 and a SiH content (average content) per molecule of 0.11 percent by weight in terms of weight of H (hydrido) in the SiH group.

The ladder-like silsesquioxane had a $^1$H-NMR spectrum as follows:

$^1$H-NMR (JEOL ECA500 (500 MHz, CDCl$_3$)) δ: −0.3-0.3 ppm (br), 4.7 ppm (s), 7.1-7.7 ppm (br)

Examples and Comparative Examples

Examples 1 to 7 and Comparative Examples 1 to 9 were performed by a procedure as follows.

According to Tables 1 and 2 in which the amounts of components are given in part by weight, an isocyanurate compound (C) and a silane coupling agent (D) were mixed with each other in predetermined weight proportions. The resulting mixture was further combined with a polyorganosiloxane (A) and a silsesquioxane (B), stirred at room temperature for 2 hours, and yielded a transparent solution. The solution was combined with 1.3 μl of a 2.0% platinum-cyclovinylsiloxane complex vinylcyclosiloxane solution (supplied by Wako Pure Chemical Industries, Ltd.), stirred for further 30 minutes, and yielded a curable resin composition.

The above-prepared curable resin composition was applied to a glass plate, heated at 90° C. for one hour, further heated at 150° C. for 5 hours, and yielded a colorless, transparent cured product in each of Examples 1 to 7 and Comparative Examples 1 to 9.

TABLE 1

| | | Example | | | | | | |
|---|---|---|---|---|---|---|---|---|
| | | 1 | 2 | 3 | 4 | 5 | 6 | 7 |
| Polyorganosiloxane (A) | GD-1012A | 80 | | 80 | 80 | 80 | 80 | 80 |
| | GD-1012B | 100 | | 100 | 100 | 90 | 90 | 80 |
| | KER-2500A | | 80 | | | | | |
| | KER-2500B | | 100 | | | | | |
| Silsesquioxane (B) | Synthesis Example 1 | 20 | 20 | 20 | 20 | | | 20 |
| | Synthesis Example 2 | | | | | 30 | | |
| | Synthesis Example 3 | | | | | | 30 | |
| | Synthesis Example 4 | | | | | | | 20 |
| Isocyanurate compound (C) | Monoallyl diglycidyl isocyanurate | 0.4 | 0.4 | | | 0.4 | 0.4 | 0.4 |
| | Triallyl isocyanurate | | | 0.4 | | | | |
| | Methyl diglycidyl isocyanurate | | | | 0.4 | | | |
| Silane coupling agent (D) | 3-Glycidyloxypropyltrimethoxysilane | 1.6 | 1.6 | 1.6 | 1.6 | 1.6 | 1.6 | 1.6 |

TABLE 2

| | | Comparative Example | | | | | | | | |
|---|---|---|---|---|---|---|---|---|---|---|
| | | 1 | 2 | 3 | 4 | 5 | 6 | 7 | 8 | 9 |
| Polyorganosiloxane (A) | GD-1012A | 80 | 80 | 80 | 80 | 80 | 100 | | 100 | |
| | D-1012B | 100 | 100 | 90 | 90 | 80 | 100 | | 100 | |
| | KER-2500A | | | | | | | 100 | | 100 |
| | KER-2500B | | | | | | | 100 | | 100 |
| Silsesquioxane (B) | Synthesis Example 1 | 20 | 20 | | | 20 | | | | |
| | Synthesis Example 2 | | | 30 | | | | | | |
| | Synthesis Example 3 | | | | 30 | | | | | |
| | Synthesis Example 4 | | | | | 20 | | | | |
| Isocyanurate compound (C) | Monoallyl diglycidyl isocyanurate | | | | | | | | 0.4 | 0.4 |
| | Triallyl isocyanurate | | 0.4 | | | | | | | |
| | Methyl diglycidyl isocyanurate | | | | | | | | | |
| Silane coupling agent (D) | 3-Glycidyloxypropyltrimethoxysilane | | | | | | | | 1.6 | 1.6 |

Sulfur Corrosion Test

Each of the curable resin compositions prepared in Examples 1 to 7 and Comparative Examples 1 to 9 was poured into a LED package (TOP LED OP-3, 35 mm by 28 mm, without element), heated at 90° C. for one hour, further heated at 150° C. for 5 hours, and yielded a sample.

The sample and 0.3 g of a sulfur powder (supplied by KISHIDA CHEMICAL Co., Ltd.) were placed in a 450-ml glass bottle, and the glass bottle was further placed in an aluminum case. Next, the aluminum case was placed in an oven (supplied by Yamato Scientific Co., Ltd., model number DN-64), and how the silver electrode in the LED package of the sample was corroded was observed 24 hours later. The electrode appears silvery white before the test, but, when corroded, changes in color to dark brown, and further to black with the progress of corrosion.

The criteria in the sulfur corrosion test are as follows. A sample undergoing little change in color of the silver electrode was evaluated as "A"; a sample undergoing a slight change in color to dark brown or black was evaluated as "B"; a sample undergoing a considerable change in color to dark brown or black was evaluated as "C"; and a sample undergoing complete change in color to dark brown or black was evaluated as "D". The results are given in Tables 3 and 4.

Surface Tack Test

Each of the cured products prepared in Examples 1 to 7 and Comparative Examples 1 to 9 was evaluated on surface tack. The criteria in the surface tack test were as follows. A sample cured product offering little surface tack was evaluated as "A"; and a sample offering surface tack was evaluated as "B". The results are given in Tables 3 and 4.

TABLE 3

| | Example | | | | | | |
|---|---|---|---|---|---|---|---|
| | 1 | 2 | 3 | 4 | 5 | 6 | 7 |
| Sulfur corrosion test | A | A | B | B | B | B | B |
| Surface tack test | A | B | A | A | A | A | A |

TABLE 4

| | Comparative Example | | | | | | | | |
|---|---|---|---|---|---|---|---|---|---|
| | 1 | 2 | 3 | 4 | 5 | 6 | 7 | 8 | 9 |
| Sulfur corrosion test | D | D | D | C | C | D | D | D | D |
| Surface tack test | A | A | A | A | A | A | B | A | B |

As demonstrated in Tables 3 and 4, the cured products (encapsulants) derived from the curable resin compositions according to the present invention had excellent barrier properties to a corrosive gas. In addition, as demonstrated in Table 3, samples (Examples 1 and 3 to 7) using a polyorganosiloxysilalkylene as the polyorganosiloxane (A) gave cured products that offered little surface tack and had excellent handleability.

INDUSTRIAL APPLICABILITY

The curable resin composition and cured product according to the present invention are useful for adhesives, coating agents, encapsulating agents, and other uses that require heat resistance, transparency, flexibility, and barrier properties to a corrosive gas. In particular, the curable resin composition and cured product according to the present invention are useful respectively as an encapsulating agent and an encapsulant for an optical semiconductor element (light-emitting diode).

The invention claimed is:

1. A curable resin composition comprising:
    a polyorganosiloxane (A);
    a silsesquioxane (B);
    an isocyanurate compound (C); and
    a silane coupling agent (D),
    the polyorganosiloxane (A) comprising both:
        a polyorganosiloxysilalkylene comprising a structure represented by Formula (I-1); and
        a polyorganosiloxysilalkylene comprising a structure represented by Formula (I-2), Formulae (I-1) and (I-2) expressed as follows:

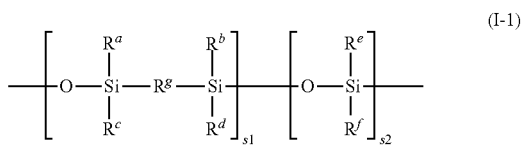

(I-1)

wherein $R^a$ to $R^f$ are, independently in each occurrence, selected from the group consisting of hydrogen, an aryl-free monovalent hydrocarbon group, and a monovalent heterocyclic group, where at least one of $R^a$ to $R^f$ is a monovalent group comprising an aliphatic carbon-carbon unsaturated bond; $R^g$ represents, independently in each occurrence, a $C_2$-$C_4$ alkylene group; and s1 and s2 each independently represent an integer of 1 or more,

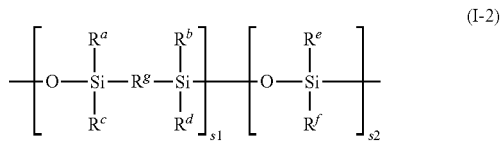

(I-2)

wherein $R^a$ to $R^f$ are, independently in each occurrence, selected from the group consisting of hydrogen, an aryl-free monovalent hydrocarbon group, and a monovalent heterocyclic group, where at least one of $R^a$ to $R^f$ is hydrogen; $R^g$ represents, independently in each occurrence, a $C_2$-$C_4$ alkylene group; and s1 and s2 each independently represent an integer of 1 or more,
    the silsesquioxane (B) comprising
        a ladder-like silsesquioxane.

2. The curable resin composition according to claim 1, wherein the silsesquioxane (B) comprises a ladder-like silsesquioxane comprising an aliphatic carbon-carbon double bond in molecule.

3. The curable resin composition according to claim 1, wherein the silsesquioxane (B) comprises a ladder-like silsesquioxane comprising a Si—H bond in molecule.

4. The curable resin composition according to claim 1, wherein the silsesquioxane (B) comprises a ladder-like silsesquioxane comprising an aryl group in molecule.

5. The curable resin composition according to claim 1, wherein the isocyanurate compound (C) comprises an isocyanurate compound represented by Formula (1):

(1)

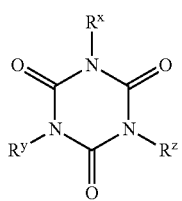

wherein $R^x$, $R^y$, and $R^z$ are each, identically or differently, selected from a group represented by Formula (2) and a group represented by Formula (3):

(2)

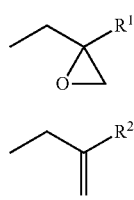

(3)

wherein $R^1$ and $R^2$ are each, identically or differently, selected from hydrogen and $C_1$-$C_8$ straight or branched chain alkyl.

6. The curable resin composition according to claim 5, wherein one or two of $R^x$, $R^y$, and $R^z$ in Formula (1) are independently the group represented by Formula (3).

7. The curable resin composition according to claim 1, wherein the silane coupling agent (D) comprises an epoxy-containing silane coupling agent.

8. A cured product of the curable resin composition according to claim 1.

9. An encapsulating agent comprising the curable resin composition according to claim 1.

10. A semiconductor device obtained by using the encapsulating agent according to claim 9.

11. The curable resin composition according to claim 1, wherein $R^g$ represents an ethylene group.

12. A curable resin composition comprising:
a polyorganosiloxane (A);
a silsesquioxane (B);
an isocyanurate compound (C);
a silane coupling agent (D); and
a hydrosilylation catalyst,
the polyorganosiloxane (A) being a polyorganosiloxane approximately devoid of aryl groups and epoxy groups,
the silsesquioxane (B) comprising a ladder-like silsesquioxane approximately devoid of epoxy groups,
the isocyanurate compound (C) comprising an isocyanurate compound represented by Formula (1):

(1)

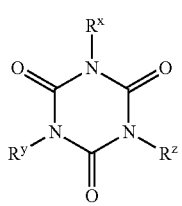

wherein $R^x$, $R^y$, and $R^z$ are each, identically or differently, selected from a group represented by Formula (2) and a group represented by Formula (3), where one or two of $R^x$, $R^y$, and $R^z$ are independently the group represented by Formula (3), Formulae (2) and (3) expressed as follows:

(2)

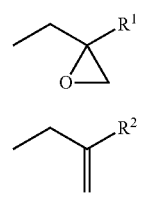

(3)

wherein $R^1$ and $R^2$ are each, identically or differently, selected from hydrogen and $C_1$-$C_8$ straight or branched chain alkyl.

13. The curable resin composition according to claim 12, wherein the polyorganosiloxane (A) comprises both:
a polyorganosiloxysilalkylene comprising a structure represented by Formula (I-1); and
a polyorganosiloxysilalkylene comprising a structure represented by Formula (I-2), Formulae (I-1) and (I-2) expressed as follows:

(I-1)

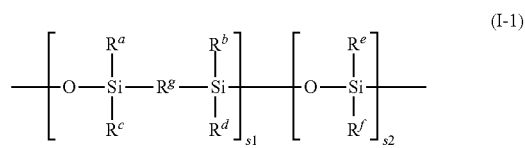

wherein $R^a$ to $R^f$ are, independently in each occurrence, selected from the group consisting of hydrogen, an aryl-free monovalent hydrocarbon group, and a monovalent heterocyclic group, where at least one of $R^a$ to $R^f$ is a monovalent group comprising an aliphatic carbon-carbon unsaturated bond; $R^g$ represents, independently in each occurrence, an aryl-free divalent hydrocarbon group; and s1 and s2 each independently represent an integer of 1 or more, (I-2)

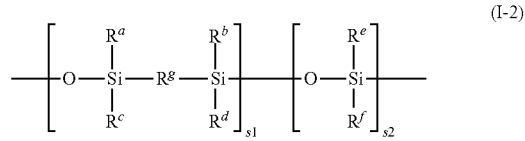

wherein $R^a$ to $R^f$ are, independently in each occurrence, selected from the group consisting of hydrogen, an aryl-free monovalent hydrocarbon group, and a monovalent heterocyclic group, where at least one of $R^a$ to $R^f$ is hydrogen; $R^g$ represents, independently in each occurrence, an aryl-free divalent hydrocarbon group; and s1 and s2 each independently represent an integer of 1 or more.

14. The curable resin composition according to claim 12, wherein the silane coupling agent (D) comprises an epoxy-containing silane coupling agent.

15. A cured product of the curable resin composition according to claim 12.

16. An encapsulating agent comprising the curable resin composition according to claim 12.

17. A semiconductor device obtained by using the encapsulating agent according to claim 16.

18. A curable resin composition comprising:
a polyorganosiloxane (A);
a silsesquioxane (B);
an isocyanurate compound (C); and
a silane coupling agent (D),
the polyorganosiloxane (A) comprising
a polyorganosiloxysilalkylene comprising a structure represented by Formula (I):

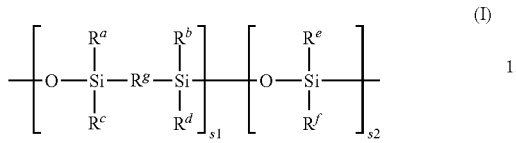

wherein $R^a$, $R^b$, $R^c$, $R^d$, $R^e$, and $R^f$ are, independently in each occurrence, selected from the group consisting of hydrogen, an aryl-free monovalent hydrocarbon group, and a monovalent heterocyclic group; $R^g$ represents, independently in each occurrence, an aryl-free divalent hydrocarbon group; and s1 and s2 each independently represent an integer of 1 or more,
the silsesquioxane (B) comprising
a ladder-like silsesquioxane,
the isocyanurate compound (C) comprising an isocyanurate compound represented by Formula (1):

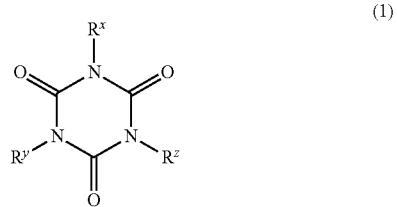

wherein $R^x$, $R^y$, and $R^z$ are each, identically or differently, selected from a group represented by Formula (2) and a group represented by Formula (3), where one or two of $R^x$, $R^y$, and $R^z$ are independently the group represented by Formula (3), Formulae (2) and (3) expressed as follows:

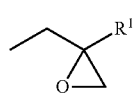

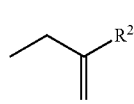

wherein $R^1$ and $R^2$ are each, identically or differently, selected from hydrogen and $C_1$-$C_8$ straight or branched chain alkyl,
wherein the curable resin composition comprises the silsesquioxane (B) in a content of from 7 to 40 percent by weight based on the total amount (100 percent by weight) of the curable resin composition.

19. The curable resin composition according to claim 18, wherein the silsesquioxane (B) comprises a ladder-like silsesquioxane comprising an aliphatic carbon-carbon double bond in molecule.

20. The curable resin composition according to claim 18, wherein the silsesquioxane (B) comprises a ladder-like silsesquioxane comprising a Si—H bond in molecule.

21. The curable resin composition according to claim 18, wherein the silsesquioxane (B) comprises a ladder-like silsesquioxane comprising an aryl group in molecule.

22. The curable resin composition according to claim 18, wherein the polyorganosiloxane (A) comprises both:
a polyorganosiloxysilalkylene comprising a structure represented by Formula (I-1); and
a polyorganosiloxysilalkylene comprising a structure represented by Formula (I-2), Formulae (I-1) and (I-2) expressed as follows:

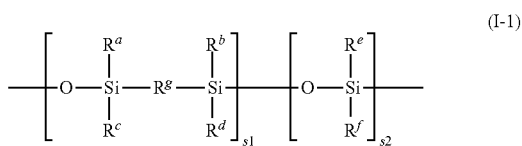

wherein $R^a$ to $R^f$ are, independently in each occurrence, selected from the group consisting of hydrogen, an aryl-free monovalent hydrocarbon group, and a monovalent heterocyclic group, where at least one of $R^a$ to $R^f$ is a monovalent group comprising an aliphatic carbon-carbon unsaturated bond; $R^g$ represents, independently in each occurrence, an aryl-free divalent hydrocarbon group; and s1 and s2 each independently represent an integer of 1 or more,

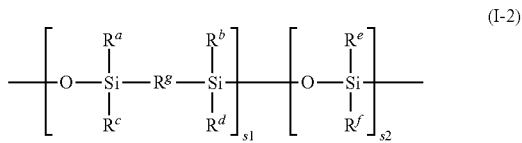

wherein $R^a$ to $R^f$ are, independently in each occurrence, selected from the group consisting of hydrogen, an aryl-free monovalent hydrocarbon group, and a monovalent heterocyclic group, where at least one of $R^a$ to $R^f$ is hydrogen; $R^g$ represents, independently in each occurrence, an aryl-free divalent hydrocarbon group; and s1 and s2 each independently represent an integer of 1 or more.

23. The curable resin composition according to claim 18, wherein the silane coupling agent (D) comprises an epoxy-containing silane coupling agent.

24. A cured product of the curable resin composition according to claim 18.

25. An encapsulating agent comprising
the curable resin composition according to claim 18.

26. A semiconductor device obtained by using the encapsulating agent according to claim 25.

* * * * *